(12) United States Patent
Khemka et al.

(10) Patent No.: US 6,528,849 B1
(45) Date of Patent: Mar. 4, 2003

(54) DUAL-GATE RESURF SUPERJUNCTION LATERAL DMOSFET

(75) Inventors: Vishnu K. Khemka, Scottsdale, AZ (US); Vijay Parthasarathy, Phoenix, AZ (US); Ronghua Zhu, Chandler, AZ (US); Amitava Bose, Tempe, AZ (US)

(73) Assignee: Motorola, Inc., Schaumburg, IL (US)

(*) Notice: Subject to any disclaimer, the term of this patent is extended or adjusted under 35 U.S.C. 154(b) by 18 days.

(21) Appl. No.: 09/652,813

(22) Filed: Aug. 31, 2000

(51) Int. Cl.$^7$ .......................... H01L 29/78; H01L 29/94
(52) U.S. Cl. ...................... 257/342; 257/341; 257/335; 257/401
(58) Field of Search ................................ 257/288, 335, 257/337, 339, 348, 392, 341–5, 401, 409

(56) References Cited

U.S. PATENT DOCUMENTS

| | | | |
|---|---|---|---|
| 4,754,310 A | | 6/1988 | Coe .............................. 357/13 |
| 5,119,159 A | * | 6/1992 | Hoshi .......................... 357/43 |
| 5,216,275 A | | 6/1993 | Chen ............................ 257/493 |
| 6,097,063 A | * | 8/2000 | Fujihira ........................ 257/339 |
| 6,111,289 A | * | 8/2000 | Udrea ........................... 257/328 |

OTHER PUBLICATIONS

Spitz, J. et al, "2.6 kV 4H–SiC Lateral DMOSFET's", IEEE Electron Device Letters, vol. 19, No. 4, pp. 100–102, Apr. 1998.*

Fujishima, N. et al, "High–Performance Lateral DMOSFET with Oxide Sidewall–Spacers", Proc. of the 6$^{th}$ Int. Symposium on Power Semiconductor Devices & IC's, Daovs, Switserland May 31–Jun. 2, 1994 (IEEE Cat. #: 94CH3377–9).*

Y. Kawaguchi et al., "Predicted Electrical Characteristics of 4500 V Super Multi–Resurf MOSFETs", IEEE, Apr. 1999, pp. 95–98.

L. Lorenz et al., "COOLMOS™—a new milestone in high voltage Power MOS", IEEE, Apr. 1999, pp. 3–10.

T. Fujihira, "Theory of Semiconductor Superjunction Devices" Jpn. J. Appl. Phys., vol. 36, Oct. 1997, Part 1, No. 10, pp. 6254–6262.

* cited by examiner

*Primary Examiner*—Nathan J. Flynn
*Assistant Examiner*—Johannes P Mondt

(57) ABSTRACT

A MOSFET includes a source region, a first channel region proximate to the source region, a first gate region adjacent to the first base region, a drain region, a second channel region proximate to the drain region, and a second gate region adjacent to the second channel region. A first channel is formed within the first channel region in dependence upon a first voltage applied to the first gate region with respect to at least a first portion of the source region, and a second channel is formed within the second channel region in dependence upon a second voltage applied to the second gate region with respect to at least a second portion of the drain region. The MOSFET further includes a drift region coupled between the first channel region and the second channel region, where the drift region includes a set of alternating columns, each of which is also coupled between the first base region and the second base region. The set of alternating columns includes a plurality of columns doped with N– type impurities alternating with a plurality columns doped with P– type impurities.

19 Claims, 1 Drawing Sheet

US 6,528,849 B1

DUAL-GATE RESURF SUPERJUNCTION LATERAL DMOSFET

FIELD OF THE INVENTION

The present invention relates generally to power semiconductor devices, and in particular relates to power MOSFETs.

BACKGROUND OF THE INVENTION

A fundamental consideration in the design of integrated circuits is the physical size of the electrical components to be included on the integrated circuits. The value of an integrated circuit increases as the size of the electrical components on the integrated circuit decreases, since the number of electrical components that can be included on a given integrated circuit increases as the physical size of the electrical components is reduced.

Integrated circuits often include different types of electrical components, ranging from logic components (e.g., flip-flops) and analog components (e.g., NPN bipolar junction transistors) to power electronics components such as power MOSFETs (metal-oxide-semiconductor field-effect transistors). Although recent improvements in the design of integrated circuits have led to reductions in size for each of these types of electrical components, there has grown a disparity in the rates of size reduction between different types of electrical components. In particular, where in certain instances the sizes of logic components have been reduced by two orders of magnitude, the sizes of power components have only been reduced one or less order of magnitude.

That the rates of size reduction of power components on integrated circuits have been lower than the rates of size reduction for some other integrated circuit components is significant. On many integrated circuits, power components already take up one-third to one-half of the total area of the integrated circuits. As the sizes of other types of electrical components continue to shrink at a faster rate than the sizes of power components, the proportion of the total area of integrated circuits that is taken up by power components continues to increase. Thus, the rates of reduction in the overall sizes of integrated circuits are being increasingly limited by the slow rates of size reduction concerning power components.

A figure of merit that is commonly employed as an indication of the relative sizes of power components on integrated circuits is the specific on-resistance, which is defined as the resistance of the power component when it is conducting current in its on state, multiplied by the area of the power component. Minimization of the specific on-resistance of a power component corresponds to minimization of the area, and consequently the size, of the power component. One type of power component for which reductions in specific on-resistance (and consequently reductions in size) have become increasingly difficult is the lateral DMOSFET, which is a double-diffused metal-oxide-semiconductor field-effect transistor, and which is "lateral" insofar as the active, conducting portions of the DMOSFET are all located along a top surface of the device.

Reductions in the specific on-resistance of the lateral DMOSFET are difficult largely because it is typically desirable for the DMOSFET to have a high breakdown voltage ($BV_{dss}$) so that the DMOSFET can sustain high voltages applied between its drain and source terminals in its off state without conducting current. In order to have a high breakdown voltage, a conventional lateral DMOSFET typically requires a long drift region between the source and drain regions of the lateral DMOSFET, which increases the specific on-resistance (and size) of the lateral DMOSFET. Although reduced doping of the drift region also tends to increase the breakdown voltage, such reduced doping of the drift region is counterproductive insofar as it tends to further increase the specific on-resistance. Further, size reductions in the cross sectional width of the drift region (perpendicular to the axis connecting the drain and source terminals) are not effective for reducing the specific on-resistance because, in addition to reducing the area of the drift region, such size reductions also tend to reduce the conductivity and increase the resistance of the drift region when the lateral DMOSFET is in its on state. Increased resistance within the drift region is particularly undesirable because it increases the power consumption and heat dissipation of the lateral DMOSFET when it is operating in its on state.

Referring to FIG. 1 (Prior Art), schematically one embodiment of a conventional NMOS lateral DMOSFET 10 includes a source region 12 that is doped with P+ type impurities, a drift region 14 that is doped with N− type impurities, and a drain region 16 that is doped with N+ type impurities. As shown by a first curve 22 in FIG. 2 (Prior Art), when the lateral DMOSFET 10 is in its off state (because the voltage applied between the gate and source of the DMOSFET is zero) and a positive voltage is applied between the drain region 16 and the source region 12, a nonzero electric field is created within the drift region 14. The electric field varies approximately linearly from a maximum occurring at or near a junction 18 between the source region 12 and the drift region 14 and a minimum (e.g., zero electric field) occurring at a point 24 somewhere along the drift region.

The voltage applied to the lateral DMOSFET 10 between the drain region 16 and the source region 12 exceeds the breakdown voltage when the voltage becomes sufficiently large such that the maximum electric field exceeds a critical level, for example, 40 Volts per micron. Consequently, the lateral DMOSFET must be designed so that, given off state voltages between the drain region 16 and the source region 12 that are below the desired breakdown voltage, the maximum electric field does not exceed the critical level. As the length of the drift region 14 decreases, the critical level of the electric field is attained at a lower voltage. As a result, for the lateral DMOSFET to be able to sustain a desired breakdown voltage, the length of the drift region must be maintained above a minimum length. Further, as a result of the need for the drift region length to be maintained above a certain minimum length, the specific on-resistance is compromised, and hence there is a fundamental tradeoff between the specific on-resistance and the breakdown voltage.

It is known in the art to modify the simple NMOS lateral DMOSFET discussed above in several ways so that the specific on-resistance of the DMOSFET can be reduced without compromising the desired high breakdown voltage. One known modification is to provide an additional layer of silicon doped with P− type impurities underneath the drift region 14, which is shown in FIG. 1 as a RESURF region 32. Such a modified lateral DMOSFET is termed a NMOS Reduced Surface Field (RESURF) lateral DMOSFET 20. The RESURF lateral DMOSFET 20 can have the same breakdown voltage as, and a lower specific on-resistance than, a simple lateral DMOSFET because extra depletion of electrons occurs from the drift region of the RESURF lateral DMOSFET when the DMOSFET is in its off state. Specifically, extra depletion occurs due to the interaction of the drift region 14 with the RESURF region 32, in addition to the normal depletion that occurs between the drift region and the source region 12.

As shown by curve 28 of FIG. 2, the extra depletion within the RESURF lateral DMOSFET 20 causes the non-zero electric field to be distributed throughout the drift region 14 such that the electric field distribution is flattened and, in particular, reduces the maximum electric field that occurs at any point within the drift region. Specifically, given the application of the same voltage between the drain region 16 and source region 12 of the RESURF lateral DMOSFET 20 as assumed with respect to the simple lateral DMOSFET 10 discussed above (where both DMOSFETs have drift regions of equal dimensions), the resulting electric field within the drift region 14 is lower at the junction 18 for the RESURF lateral DMOSFET than for the simple lateral DMOSFET. With the adding of the RESURF region 32 to the simple lateral DMOSFET to create the RESURF lateral DMOSFET 20, therefore, a greater voltage must be applied between the drain region 16 and source region 12 of the DMOSFET to produce a maximum electric field that exceeds the critical level above which breakdown occurs than for the simple lateral DMOSFET 10. Consequently, a RESURF lateral DMOSFET can have a smaller drift region 14, both in terms of the length of the drift region between the drain region 16 and source region 12 and in terms of the cross sectional width of the drift region, or a higher doping level than a comparable simple lateral DMOSFET having the same breakdown voltage.

A second known modification for reducing the specific on-resistance of a lateral DMOSFET without compromising its breakdown voltage is to divide up the drift region into multiple parallel columns that extend between the source region and the drain region, where the columns alternate between columns doped with P− impurities and columns doped with N− impurities. Such a modified drift region is termed a superjunction. Referring to FIG. 3 (Prior Art), a RESURF lateral DMOSFET having this modified drift region is termed a RESURF superjunction lateral DMOSFET 30 and includes a drift region or layer 54 positioned above a RESURF region or layer 50, which in turn is positioned above a substrate region 40.

The drift region 54 extends between a drain 56 and a source region 52 of the RESURF superjunction lateral DMOSFET 30. The drain is doped with N+ impurities and the source region 52 includes a base region 62 doped with P+ impurities, a P+ region 64 doped with P+ impurities and a N+ region 66 doped with N+ impurities. The base region 62 surrounds the P+ and N+ regions 64, 66, and the P+ region and N+ region typically are coupled to one another by way of metallization (not shown) along the surface of the DMOSFET 30. The RESURF superjunction lateral DMOSFET 30 further includes a gate 68 along its surface. The base region 62 acts both as the source of the lateral DMOSFET 30, and as a channel 51 of the lateral DMOSFET, which is opened and closed due to the voltage applied between the gate 68 and the source region 52. In alternate embodiments, the lateral DMOSFET has source and channel regions that are more distinct from one another rather than being encompassed within a single base region.

As shown, the drift region 54 of the RESURF superjunction lateral DMOSFET 30 is made up of alternating columns that alternate between columns 55 doped with N− impurities and columns 53 doped with P− impurities. Consequently, each respective column doped with N− impurities is depleted not only by RESURF region 50 (as in the RESURF lateral DMOSFET 20 discussed above) but also by the columns doped with P− impurities positioned on one or both sides of that column. Each respective column doped with N− impurities therefore receives proportionately greater depletion in the RESURF superjunction lateral DMOSFET 30 than an equivalent volume of the drift region of a RESURF lateral DMOSFET would receive. This extra depletion, for the reasons already discussed above with respect to the RESURF lateral DMOSFET 20, allows for the RESURF superjunction lateral DMOSFET 30 to maintain the same high breakdown voltage as the RESURF lateral DMOSFET despite having an even smaller drift region 54 between the drain 56 and the source region 52 (or a higher doping level).

The addition of the superjunction in the RESURF superjunction lateral DMOSFET 30 shown in FIG. 3 is highly advantageous in terms of the degree to which the specific on-resistance of the DMOSFET can be reduced relative to the RESURF lateral DMOSFET 20 without reducing the breakdown voltage of the DMOSFET. In certain embodiments, the specific on-resistance and size of the RESURF superjunction lateral DMOSFET 30 can be reduced by up to a factor of five relative to a comparable RESURF lateral DMOSFET 20 having the same breakdown voltage. Despite the reductions in the specific on-resistance enabled by the development of the RESURF superjunction lateral DMOSFET 30, however, further reductions in the specific on-resistance of lateral DMOSFETS are necessary as the sizes of logic and other components of integrated circuits continue to shrink and the appetite for including more and more components on a given integrated circuit continues unabated.

Further, despite the degree of reduction in specific on-resistance that the superjunction makes possible, the structure of the RESURF superjunction lateral DMOSFET 30 is limiting insofar as only half of the drift region 54 is made up of columns 55 doped with N− impurities. Because the RESURF superjunction lateral DMOSFET 30 is an NMOS device, the current passing between the drain 56 and the source region 52 when the RESURF superjunction lateral DMOSFET is in its on state is made up of electrons, and consequently only passes through that portion of the drift region 54 that is doped with N− impurities, namely, columns 55. Consequently, the overall conduction area of the drift region 54 for the RESURF superjunction lateral DMOSFET 30 is only approximately half that of a RESURF lateral DMOSFET 20 having a drift region 14 of the same overall size, and so the DMOSFET 30 in its on state has approximately twice the resistance and dissipates twice as much power (given the same current) as a RESURF lateral DMOSFET having a drift region of the same size.

It would be advantageous, therefore, if a new lateral DMOSFET could be developed that would further improve upon the RESURF superjunction lateral DMOSFET by allowing for a lateral DMOSFET with an even smaller specific on-resistance and consequently smaller overall size without any reduction in breakdown voltage. It would further be advantageous if an integrated circuit could be developed on which such a new lateral DMOSFET was employed, such that the integrated circuit could hold a greater number of components overall than was possible using conventional lateral DMOSFETs. It would additionally be advantageous if this new lateral DMOSFET overcame the limitations of the conventional RESURF superjunction lateral DMOSFET relating to the alternation of columns doped with N− and P− impurities within the drift region and relative increase in resistance due to the reduction in N− type material through which the DMOSFET conducts in its on state.

SUMMARY OF THE INVENTION

In accordance with one embodiment of the present invention, a MOSFET includes a source region, a first channel region proximate to the source region, a first gate electrode overlying the first channel region, a drain region, a second channel region proximate to the drain region, and a second gate electrode overlying the second channel region. A first channel is formed within the first channel region in dependence upon a first voltage applied to the first gate electrode with respect to at least a first portion of the source region, and a second channel is formed within the second channel region in dependence upon a second voltage applied to the second gate electrode with respect to at least a second portion of the drain region. The MOSFET further includes a drift region coupled between the first channel region and the second channel region, where the drift region is includes a set of alternating columns, each of which is also coupled between the first channel region and the second channel region. The set of alternating columns includes a plurality of columns doped with N− type impurities alternating with a plurality columns doped with P− type impurities.

In accordance with another embodiment of the present invention, a method of operating a MOSFET includes applying a positive voltage from a first gate electrode to a first channel region of the MOSFET, and conducting electrons from the source region to a drain region through a first plurality of columns doped with N− impurities within a drift region of the MOSFET in response to the application of the positive voltage. The method further includes applying a negative voltage from a second gate electrode to the drain region of the MOSFET, and conducting holes from the drain region to the source region through a second plurality of columns doped with P− impurities within the drift region in response to the application of the negative voltage.

The present invention further relates to an integrated circuit including a semiconductor transistor device. The integrated circuit comprises a means for conducting electrons in a first direction through the semiconductor transistor device in an on state, and a means for conducting holes in a second direction through the semiconductor transistor device in the on state. The integrated circuit additionally includes a means for controlling the conduction of electrons and holes by way of the application of at least one voltage. The means for conducting electrons depletes holes from the means for conducting holes and the means for conducting holes depletes electrons from the means for conducting electrons in an off state.

The present invention additionally relates to a method of operating a MOSFET. The method includes applying a positive voltage from a first gate region to a source region of the MOSFET, and conducting electrons from the source region to a drain region through a first plurality of columns doped with N− impurities within a drift region of the MOSFET in response to the application of the positive voltage. The method further includes applying a negative voltage from a second gate region to the drain region of the MOSFET, and conducting holes from the drain region to the source region through a second plurality of columns doped with P− impurities within the drift region in response to the application of the negative voltage.

DETAILED DESCRIPTION OF THE INVENTION

The present inventors have recognized that, in accordance with an embodiment of the present invention, a new RESURF superjunction lateral DMOSFET can be designed having a second gate positioned adjacent to a drain region that includes an additional base region doped with N+ impurities surrounding both a P+ region and a N+ region connected by metallization. Then, by controlling the two gates, the dual-gate RESURF superjunction lateral DMOSFET ("dual-gate MOSFET") can be operated as both a NMOS device and a PMOS device. That is, in its on state, the dual-gate DMOSFET not only conducts electrons from the source region to the drain region, but also conducts holes from the drain region to the source region. Because both the columns doped with N− impurities and the columns doped with P− impurities are able to conduct current, the conductivity of the dual-gate DMOSFET is higher than that of a comparable single-gate RESURF superjunction lateral DMOSFET having a drift region of the same size. Consequently, the specific on-resistance of the dual-gate DMOSFET can be reduced relative to that of the comparable single-gate RESURF superjunction lateral DMOSFET without reducing the breakdown voltage of the dual-gate DMOSFET.

Figure 4:
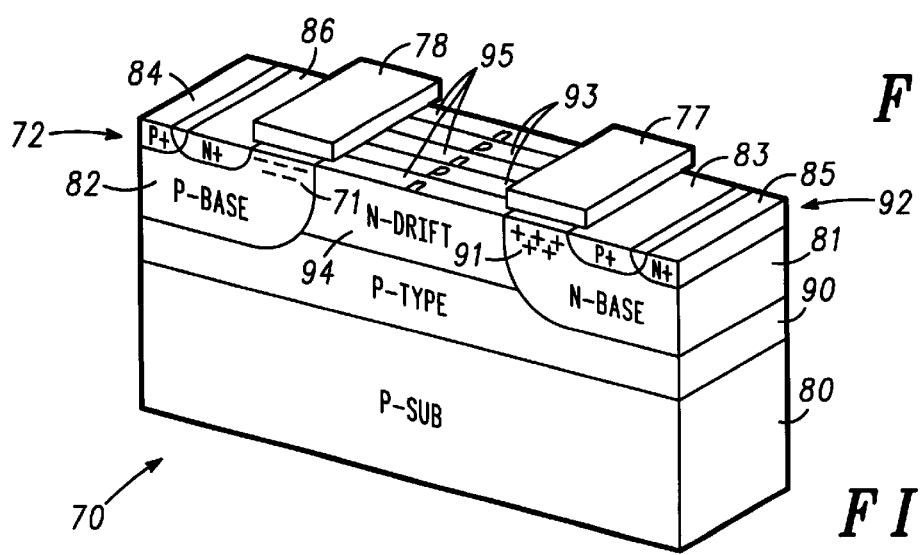
FIG. 4 is a schematic diagram of a dual-gate RESURF superjunction lateral DMOSFET shown in accordance with the present invention.

Referring to FIG. 4, a new RESURF superjunction lateral DMOSFET has a first gate 78 and a second gate 77 positioned between a source region 72 and a drain region 92, and can be termed a dual-gate RESURF superjunction lateral DMOSFET (or simply "dual-gate DMOSFET"). Like the prior art RESURF superjunction lateral DMOSFET 30 discussed above, the dual-gate DMOSFET has a substrate region 80, a RESURF region 90 above the substrate region, and a drift region 94 positioned above the RESURF region along the surface of the DMOSFET. The drift region 94 again includes multiple parallel columns which alternate between columns doped with P− impurities 93 and columns doped with N− impurities 95. The drift region 94 extends between the source region 72 and the drain region 92.

As with respect to the prior art RESURF superjunction lateral DMOSFET 30, the source region 72 of the dual-gate DMOSFET 70 includes a first base region 82 doped with P+ impurities, which surrounds a P+ region 84 and a N+ region 86 (doped respectively with P+ and N+ impurities) which are coupled together by way of metallization along the surface of the DMOSFET (not shown). Unlike the conventional RESURF superjunction lateral DMOSFET 30, the new dual-gate DMOSFET 70 additionally includes the more complicated drain region 92 in place of the simple drain 56 discussed above. The drain region 92 includes a second base region 81 doped with N+ impurities, which surrounds both a P+ region 83 and a N+ region 85 (doped respectively with P+ and N+ impurities) which are coupled together by way of metallization on the surface of the DMOSFET (not shown).

The overall structure of the drain region 92 is thus the inverse of the structure of the source region 72 of the dual-gate DMOSFET 70 in terms of how the three component regions of each of the source and drain regions are doped.

As in the conventional RESURF superjunction lateral DMOSFET 30, the dual-gate DMOSFET 70 includes the first gate 78 positioned along the surface of the DMOSFET near the intersection between the source region 72 and the drift region 94. In contrast to the conventional DMOSFET 30, however, the new dual-gate DMOSFET 70 includes the second gate 77 also positioned along the surface of the DMOSFET near the intersection between the drain region 92 and the drift region 94. Each of the gates 78, 77 can be formed from polysilicon or be doped with P− and N− impurities, respectively. The first base region 82 doped with P+ impurities serves the dual function of acting as part of the source of the DMOSFET 70 and also as a first channel 71 of the DMOSFET, which can be opened and closed based upon the voltage applied between the first gate 78 and the source region 72. Likewise, the second base region 81 that is doped with N+ impurities serves the dual function of being part of the drain of the DMOSFET and also acting as a second channel 91, which is opened and closed based upon the voltage applied between the second gate 77 and the drain region 92. In alternate embodiments, the dual-gate DMOSFET 70 has source and drain regions that are separated (or at least more distinct) from the channel regions controlled by the first and second gates 78 and 77, respectively, in place of the dual-purpose source and drain regions 72, 92.

The structure of the dual-gate DMOSFET 70, with its dual gates 78 and 77 and dual base regions 82 and 81 enables the dual-gate DMOSFET to be operated simultaneously as a NMOS device and a PMOS device. Specifically, by applying a positive voltage from the first gate 78 to the source region 72, the dual-gate DMOSFET 70 enters its on state as an NMOS device, and conducts current through the drift region 94 via the columns doped with N− impurities 95. Conversely, when a negative voltage is applied from the second gate 77 to the drain region 92 of the dual-gate DMOSFET 70, the dual-gate DMOSFET enters its on state as a PMOS device and conducts holes through the drift region 94 via the columns doped with P− impurities 93. The drift region 94 does not conduct any current when the voltages applied between the first gate 78 and the source region 72 and between the second gate and the drain region 92 are both zero, such that the dual-gate DMOSFET 70 is in its off state as both a NMOS device and a PMOS device.

Figure 1:
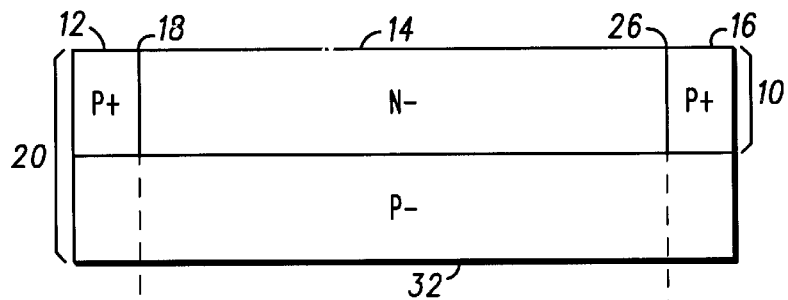
FIG. 1 is a schematic diagram of a prior art simple lateral DMOSFET, and a prior art RESURF lateral DMOSFET.
Figure 2:
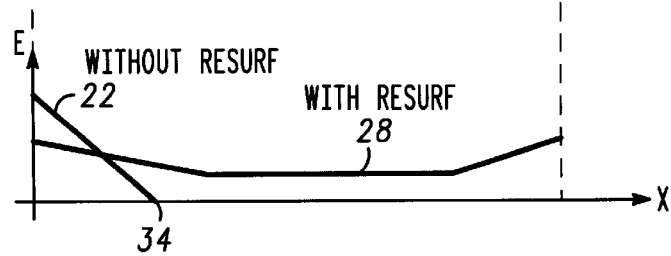
FIG. 2 is a graph showing the variation of electric fields within the drift regions of both of the DMOSFETs of FIG. 1 when a voltage is applied between the drains and sources of those DMOSFETS in their off states.
Figure 3:
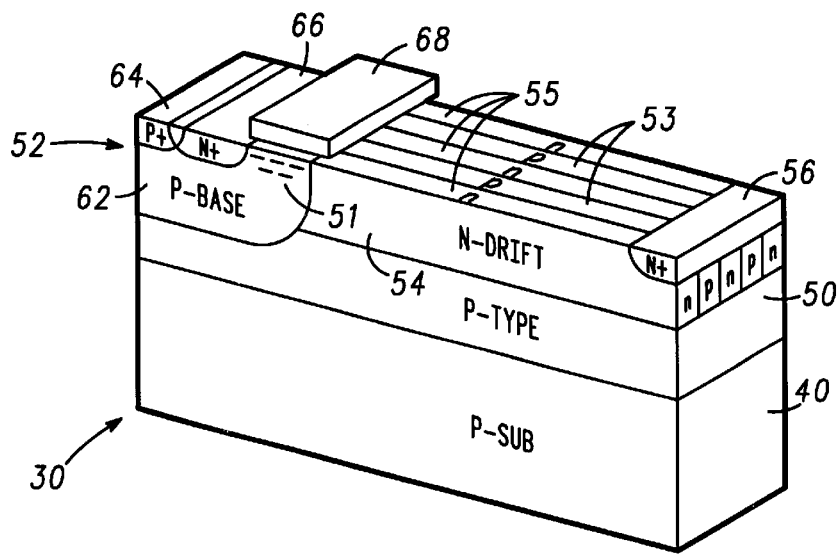
FIG. 3 is a schematic diagram of a prior art RESURF superjunction lateral DMOSFET.

Because the dual-gate DMOSFET 70 can operate as both a NMOS device and a PMOS device in its on state such that it conducts both electrons through the columns 95 and holes through the columns 93, the dual-gate DMOSFET has a greater conductivity and a lower resistance in its on state than the single-gate RESURF superjunction lateral DMOSFET 30 discussed with respect to FIG. 3. Specifically, the resistance of the dual-gate DMOSFET 70 in its on state is approximately 30% less than that of the single-gate RESURF superjunction lateral DMOSFET having a drift region of the same overall size. Additionally, there is no reduction of the breakdown voltage of the dual-gate DMOSFET 70 relative to the single-gate DMOSFET 30 that occurs due to the addition of the second gate 77 and modification of the drain region 92.

The breakdown voltage of a lateral DMOSFET is not reduced by decreases in the cross sectional width of the drift region (where the cross sectional width dimension is perpendicular to both an axis connecting the drain region 92 and the source region 72 and to a second axis perpendicular to the surface of the lateral DMOSFET). Consequently, the cross sectional width of the drift region 94 of the dual-gate DMOSFET 70 can be reduced relative to the cross-sectional width of the drift region 54 of the single-gate DMOSFET 30 by approximately 30% without either increasing the on state resistance of the DMOSFET or reducing the breakdown voltage of the DMOSFET. Thus, a dual-gate DMOSFET can have the same operational characteristics (aside from the necessity of controlling two gates) as a single-gate DMOSFET that is approximately 30% greater in size, and thus the dual-gate DMOSFET 70 is advantageous relative to the single-gate DMOSFET 30.

As shown in FIG. 4, the preferred embodiment of the dual-gate DMOSFET 70 has columns 95, 93 which are of equal cross sectional width. The decrease in the specific on-resistance due to the implementation of the dual-gate structure in place of the conventional single-gate structure is approximately 30% rather than 50% due to the mobility of holes being lower than that of electrons. In the off state, depletion of both holes from columns 93 and electrons from columns 95 occurs due to the alternation of columns doped with P− and N− impurities. Specifically, the depletion of holes from columns 93 occurs due to columns 95 and the second base region 81, while the depletion of electrons from columns 95 occurs due to columns 93, the first base region 81 and the RESURF region 90. Also, in the preferred embodiment, the first base 82 is doped with P+ impurities rather than P− impurities, and the second base 81 is doped with N+ impurities rather than N− impurities, although in alternate embodiments, the first and second bases can be doped with P− and N− impurities, respectively. Additional embodiments of the present invention are also envisioned. For example, in addition to the drift region 94 being divided into alternating columns 95, 93, in one alternate embodiment the RESURF region 90 is also divided into columns that alternate between columns being doped with N− impurities and columns being doped with P− impurities.

In such embodiment, each column 95 of the drift region 94 which is doped with N− impurities has a parallel column which is positioned beneath it in the RESURF region 90 and which is doped with P− impurities. Likewise, each column 93 of the drift region 94 which is doped with P− impurities has a parallel column doped with N− impurities which is positioned beneath it in the RESURF region 90. Thus, a cut-away view of the drift region 94 and the RESURF region 90 is a checkerboard of columns doped with P− and N− impurities. In further embodiments, there is more than one layer in between the drift region 94 and the substrate 80, e.g., more than one RESURF region 90 or more than one drift region 94. In the case where more than one drift region 94 is employed within the DMOSFET, the gates 78 and 77 must extend vertically into the DMOSFET in order to properly control operation of the DMOSFET. In such embodiments, alternating columns doped with N− and P− impurities can again be employed on levels other than the top drift region level, or even all levels, such that a cut-away view of the drift region and the layers below the drift region even more closely appears to be that of a checkerboard.

While the foregoing specification illustrates and describes the preferred embodiments of this invention, it is to be understood that the invention is not limited to the precise construction herein disclosed. The invention can be embodied in other specific forms without departing from the spirit or essential attributes. Accordingly, reference should be made to the following claims, rather than to the foregoing specification, as indicating the scope of the invention.

What is claimed is:

1. A MOSFET comprising:
   a source region;
   a first channel region proximate to the source region;
   a first gate electrode overlying the first channel region, wherein a first channel is formed within the first channel region in dependence upon a first voltage applied to the first gate electrode with respect to at least a first portion of the source region;
   a drain region;
   a second channel region proximate to the drain region;
   a second gate electrode overlying the second channel region, wherein a second channel is formed within the second channel region in dependence upon a second voltage applied to the second gate electrode with respect to at least a second portion of the drain region, and wherein the second gate electrode is configured to be electrically biased independently from the first gate electrode; and
   a drift region coupled between the first channel region and the second channel region, wherein the drift region includes a set of alternating columns, each of which is also coupled directly between the first channel region and the second channel region, each of which is also partially located under the first and second gate electrodes, and wherein the set of alternating columns includes a plurality of columns doped with N− type impurities alternating with a plurality of columns doped with P− type impurities.

2. The MOSFET of claim 1, wherein the source region includes a first base region which further includes the first channel region, and wherein the drain region includes a second base region which further includes the second channel region.

3. The MOSFET of claim 1, further comprising a substrate region positioned below the drift region.

4. The MOSFET of claim 3, further comprising a RESURF region positioned in between the drift region and the substrate region.

5. The MOSFET of claim 4, wherein the RESURF region is doped with P− type impurities.

6. The MOSFET of claim 4, wherein the RESURF region further comprises a set of alternating columns which includes a plurality of columns doped with N− type impurities alternating with a plurality of columns doped with P− type impurities, wherein each column doped with N− type impurities of the drift region has a respective column doped with P− type impurities below it in the RESURF region, and each column doped with P− type impurities of the drift region has a respective column doped with N− type impurities below it in the RESURF region.

7. The MOSFET of claim 3, further comprising at least two regions between the drift region and the substrate region.

8. The MOSFET of claim 7, wherein each of the at least two regions includes a respective set of alternating columns which includes a plurality of columns doped with N− type impurities alternating with a plurality of columns doped with P− type impurities, and wherein each column of the drift region has at least two columns below it in the at least two regions, where the at least two columns alternate between being doped with P− type impurities and being doped with N− type impurities.

9. The MOSFET of claim 7, wherein the at least two regions includes an additional drift region immediately below the drift region and a RESURF region between the additional drift region and the substrate region.

10. The MOSFET of claim 9, wherein the first gate region and the second gate region each extend from a surface of the MOSFET into an interior of the MOSFET.

11. A MOSFET comprising:
    a source region;
    a first channel region proximate to the source region;
    a first gate region adjacent to the first channel region, wherein a first channel is formed within the first channel region in dependence upon a first voltage applied to the first gate region with respect to at least a first portion of the source region;
    a drain region;
    a second channel region proximate to the drain region;
    a second gate region adjacent to the second channel region, wherein a second channel is formed within the second channel region in dependence upon a second voltage applied to the second gate region with respect to at least a second portion of the drain region;
    a drift region coupled between the first channel region and the second channel region, wherein the drift region includes a set of alternating columns, each of which is also coupled between the first channel region and the second channel region, and wherein the set of alternating columns includes a plurality of columns doped with N− type impurities alternating with a plurality columns doped with P− type impurities; and
    a substrate region,
    wherein the source region includes the first base region, which further includes the first channel region;
    wherein the drain region includes a second base region, which further includes the second channel region; and
    wherein the substrate region is doped with at least one of P+ and N+ impurities, the first base region is doped with P type impurities, and the second base region is doped with N type impurities.

12. The MOSFET of claim 2, wherein the source region includes, in addition to the first base region, a source terminal region, and the drain region includes, in addition to the second base region, a drain terminal region.

13. The MOSFET of claim 1, wherein the MOSFET is a DMOSFET.

14. The DMOSFET of claim 13, wherein the DMOSFET is a lateral DMOSFET.

15. The MOSFET of claim 1, wherein each of the source region and the drain region includes a P+ region and a N+ region that are shorted to one another by way of metallization.

16. The MOSFET of claim 1, wherein each column of the drift region has the same cross sectional width.

17. The MOSFET of claim 1, wherein the MOSFET conducts electrons through the columns doped with N− type impurities when a positive voltage is applied from the first gate region to the source region, and the MOSFET conducts holes through the columns doped with P− type impurities when a negative voltage is applied from the second gate region to the drain region.

18. The MOSFET of claim 1, wherein each column of the set of alternating columns has the same cross sectional width.

19. The MOSFET of claim 1, wherein:
    the source region has a P+ region and an N+ region;
    the drain region has a P+ region and an N+ region; and
    each of the set of alternating columns is located directly between each of the P+ and N+ regions of the source region and the P+ and N+ regions of the drain region.

* * * * *